US008911552B2

(12) United States Patent
Jacobson

(10) Patent No.: US 8,911,552 B2
(45) Date of Patent: Dec. 16, 2014

(54) USE OF ACOUSTIC WAVES FOR PURGING FILTERS IN SEMICONDUCTOR MANUFACTURING EQUIPMENT

(75) Inventor: Guy Jacobson, Camas, WA (US)

(73) Assignee: Wafertech, LLC, Camas, WA (US)

( * ) Notice: Subject to any disclaimer, the term of this patent is extended or adjusted under 35 U.S.C. 154(b) by 219 days.

(21) Appl. No.: 13/209,304

(22) Filed: Aug. 12, 2011

(65) Prior Publication Data
US 2013/0036969 A1 Feb. 14, 2013

(51) Int. Cl.
*B05C 11/00* (2006.01)
*B01D 29/72* (2006.01)
*B08B 9/00* (2006.01)
*B01D 27/00* (2006.01)
*B01D 33/00* (2006.01)
*B01D 33/17* (2006.01)
*H01L 21/67* (2006.01)

(52) U.S. Cl.
CPC ............ *B01D 29/72* (2013.01); *H01L 21/6715* (2013.01)
USPC ........ 118/610; 118/603; 134/22.12; 210/346; 210/388; 210/785

(58) Field of Classification Search
USPC ............................................ 118/71; 210/785
See application file for complete search history.

(56) References Cited

U.S. PATENT DOCUMENTS

| 3,477,948 | A | * | 11/1969 | Inoue | 210/695 |
| 4,253,962 | A | * | 3/1981 | Thompson | 210/414 |
| 4,529,422 | A | * | 7/1985 | Phillips | 96/417 |
| 4,902,608 | A | * | 2/1990 | Lamb et al. | 430/325 |
| 4,980,300 | A | * | 12/1990 | Miyashita et al. | 438/472 |
| 5,059,331 | A | * | 10/1991 | Goyal | 210/785 |
| 6,042,635 | A | * | 3/2000 | Chung et al. | 95/29 |
| 6,165,552 | A | * | 12/2000 | Anai et al. | 427/240 |
| 6,171,367 | B1 | * | 1/2001 | Peng et al. | 95/46 |
| 6,217,782 | B1 | * | 4/2001 | Tuori et al. | 210/785 |
| 6,221,255 | B1 | * | 4/2001 | Vadoothker | 210/739 |
| 6,284,136 | B1 | * | 9/2001 | Tuori et al. | 210/331 |
| 6,338,671 | B1 | * | 1/2002 | Kawashima et al. | 451/87 |
| 6,402,821 | B1 | * | 6/2002 | Matsuyama | 96/175 |
| 6,861,371 | B2 | * | 3/2005 | Kamikawa et al. | 438/747 |

(Continued)

OTHER PUBLICATIONS

T. Sasaki, H. Wada and T. Morikawa, Suppression of Micro-bubbles in Photoresist Coating by Step Dynamic Coating, Semiconductor Manufacturing Symposium, San Jose, CA US, 2001, IEEE International, 2001, pp. 329-332, Oct. 8-10, 2001.

(Continued)

*Primary Examiner* — Dah-Wei D Yuan
*Assistant Examiner* — Karl Kurple
(74) *Attorney, Agent, or Firm* — Duane Morris LLP

(57) ABSTRACT

An apparatus and method for qualifying a filter used to filter fluid used in a coating operation associated with photolithography or other semiconductor manufacturing processes, provides a semiconductor manufacturing tool that includes a filter and an acoustic wave generator. The filter may be housed inside a filter housing and the acoustic wave generator may produce ultrasonic, megasonic or other acoustic energy. The acoustic wave generator contacts or is in close proximity with the filter housing and provides acoustic wave energy to the filter through the housing. The acoustic wave energy causes any bubbles in the filter to become disengaged.

17 Claims, 4 Drawing Sheets

(56) References Cited

U.S. PATENT DOCUMENTS

| | | | |
|---|---|---|---|
| 7,008,540 B1* | 3/2006 | Weavers et al. | 210/636 |
| 7,282,147 B2* | 10/2007 | Kirker et al. | 210/321.69 |
| 7,435,343 B2* | 10/2008 | Yang et al. | 210/223 |
| 2002/0131875 A1* | 9/2002 | Yajima | 417/313 |
| 2005/0145567 A1* | 7/2005 | Quintel et al. | 210/636 |
| 2007/0295674 A1* | 12/2007 | Kirker et al. | 210/785 |
| 2009/0241672 A1* | 10/2009 | Gysling | 73/597 |
| 2010/0206818 A1* | 8/2010 | Leong et al. | 210/748.05 |
| 2011/0009779 A1* | 1/2011 | Romano et al. | 601/2 |
| 2012/0061314 A1* | 3/2012 | Choi et al. | 210/490 |
| 2013/0043766 A1* | 2/2013 | Takahashi et al. | 310/326 |
| 2013/0074832 A1* | 3/2013 | Gallem et al. | 128/200.14 |
| 2014/0041576 A1* | 2/2014 | Clark et al. | 118/70 |

OTHER PUBLICATIONS

W.B. Alexander, K.T. O'Dougherty, W. Liu, H.Yan and K. Mikkelsen, Reducing bubbles and particles associated with photoresist packaging materials and dispense systems, Advances in Resist Materials and Processing Technology XXIV, edited by Qinghuang Lin Proc. of SPIE vol. 6519, pp. 651939-1 through 651939-7 Apr. 2, 2007.

B. Gotlinsky, M. Mesawich, J. Beach, The effect of sub-0.1 µm filtration on 248nm photoresist performance, ELECTROIQ, The Portal for Electronics Manufacturing, http://www.electroiq.com/articles/sst/print/volume-43, issue-7/ features/the-effect-of-sub-0 . . . Jul. 1, 2000.

Membrana, Bubble Removal from Photoresist using SuperPhobic Contractors Does Away with Down-Time at Semiconductor Site, 2007, www.membrana.com as downloaded no later than Jun. 6, 2011.

* cited by examiner though of course the disclosure applies to other industries that also may use filters to filter various fluids. According to the disclosure, acoustic waves are used to purge the photolithography fluid through a filter used in the semiconductor manufacturing industry. The filter is included in a filter housing and is used in a photolithography coating tool used to coat substrates with a photolithography fluid. Acoustic waves are used to quickly purge the bubbles from the filter during initial installation of the filter and also during normal operation when bubbles form within the filter during the coating operation. The use of acoustic waves significantly reduces the time needed to purge the bubbles from the filter, therefore saving time and reducing the amount of costly photolithography fluid that is wasted during the purging operation.

USE OF ACOUSTIC WAVES FOR PURGING FILTERS IN SEMICONDUCTOR MANUFACTURING EQUIPMENT

FIELD OF THE DISCLOSURE

The disclosure is related to a method and system for using acoustic waves in the optimization of semiconductor manufacturing equipment, and more particularly to the use of acoustic waves to purge filters used in various coating operations associated with photolithography processes used in semiconductor manufacturing.

BACKGROUND

Photolithography is a critical and frequently used operation in the manufacture of semiconductor devices. Each semiconductor device undergoes multiple photolithography operations which form the patterns that transform layers of material into interconnected circuits. Each photolithography operation includes an operation that coats the substrates with a photoresist material and a develop operation that develops the exposed and patterned photoresist layer by coating the substrate with a developer. Photolithography operations may also utilize additional coating operations such as operations that coat the substrates with anti-reflective coatings, ARC's, adhesion promoters, and various other coatings. Each photolithography operation therefore includes multiple coating operations that dispense a photolithography fluid onto a substrate that is rotated to produce a coating on the substrate surface.

The manufacturing tools that are used to coat the substrates include a dispense port at which the fluid is introduced to the substrate, which is rotated to produce a very thin coating on the substrate. It is critical for the coating to include a thickness that is uniform and lies within a narrow range of acceptable thicknesses prescribed by the specification. It is also critical to obtain the desired thickness of the coated material from a corresponding amount of dispensed material because the fluids used in the various photolithography coating operations are very expensive and it would be cost prohibitive to dispense excess amounts of fluid that are simply expelled from the substrate when it is rotated, i.e. wasted. It is also important to assure that each coating operation results in a high quality coating. If there are voids in the layer coated on the substrate, if the coating is of non-uniform thickness, or if there are particles contaminating and distorting the coated film, the substrate must be reworked at considerable expense. The rework procedure is also time consuming and delays cycle time.

As such, it is critical to ensure that the fluid such as photoresist or developer, that is dispensed from the dispense port is free of particles and air bubbles and is a clean and homogeneous fluid. For this reason, each photolithography coating tool used to coat the aforementioned materials, advantageously includes a filter that filters the fluid between the fluid reservoir and the dispense port. The filters trap particles, air bubbles and other anomalies that may be included within the photolithography fluid in raw form in the reservoir. The filters must be changed on a regular basis and the associated maintenance requires a requalification of the filter and the fluid dispensing system before the tool can again be used for production runs.

The filter is, of course, porous in nature so that the fluid can pass through the filter while any particles or other anomalies will remain trapped in the filter. Various porous materials such as porous polyethylene, nylon and other suitable materials may be used as the porous filter material for photoresist filters, for example. The filter is typically retained in a filter housing through which the photolithography fluid flows. Various housing configurations are available and the housing may include an inlet port and an outlet port and often includes a purge port. When the photolithography fluid is first passed through a newly installed filter, the filter does not immediately saturate with fluid. Rather, air bubbles are created in the filter as small amounts of air remain trapped within the filter media due to the surface tension of the air bubbles adhering to the porous filter.

The bubbles often remain in the filter for an extended time and are difficult to remove. It is important to remove the bubbles from the filter. Otherwise, the bubbles will become disengaged during production operations, and delivered to the dispense port where they cause problems such as voids in the coated film, when dispensed onto the substrate. Furthermore, the bubbles act as a compressible volume which affects pump operation, adversely affecting the coating operation.

According to one conventional technique, the photolithography fluid is continuously purged through the filter for an extended time until no further bubbles are detected in the outlet line of the filter housing. While this time-consuming qualification process is underway, the tool is not available for production activity and considerable amounts of the photolithography fluid are being wasted while waiting for all of the bubbles to become disengaged from the filter. The wasted photolithography fluid represents a considerable expense, and the unavailability of the tool represents another expense.

Even during normal and continuous use, bubbles can be introduced by being drawn into the filter or as a result of outgassing or due to unconventional surface tension properties of the photolithography fluid. These bubbles also require purging using the same techniques as described supra, and which include the same shortcomings.

The present disclosure addresses these shortcomings.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a method and apparatus that readies filters used in the semiconductor manufacturing industry, for use. In particular, the disclosure relates to filters used for filtering fluids such as liquids, gels or intermediates with various viscosities, particularly those fluids used in photolithography operations. The photolithography operations include the dispensing and coating of a photolithography fluid which may be a photoresist, a developer, an ARC (anti-reflective coating), various adhesion promoters, cleaning fluids or other photolithography fluids, i.e. fluids used for coating a substrate for a photolithography operation.

According to other exemplary embodiments, the apparatus and method of the disclosure may find application in filters used in other coating operations, such as the coating of spin-on glass or other spin-on dielectrics also used in the semiconductor manufacturing industry. The apparatus and method of the disclosure may find application in any filter used to filter fluids.

The disclosure provides a dispensing and coating apparatus that dispenses a fluid onto a substrate and rotates the substrate, such that the dispensed fluid becomes a thin coating spread across the substrate. The substrate may be a semiconductor wafer used in the semiconductor fabrication industry, in one exemplary embodiment. The apparatus dispenses the fluid at a dispense port and fluid is delivered to the dispense port through various delivery systems and lines within the apparatus. The fluid is filtered before it reaches the dispense port by a filter disposed within a filter housing and included within the dispensing/coating apparatus, although, in other exemplary embodiments, the filter and filter housing may be remote from the dispensing/coating apparatus. The apparatus further includes a fluid source, which may be a bottle or other reservoir, and a pump that pumps the fluid through the filter and to the dispense port. Many such coating apparatuses are known in the art and are not described further herein.

Figure 1:
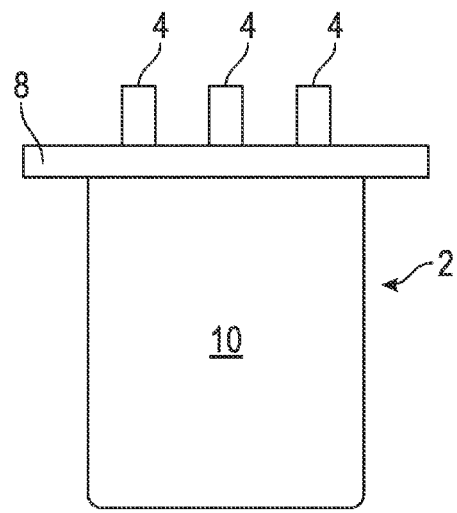
FIG. 1 is a side view showing a filter housing that contains a filter.

FIG. 1 shows an exemplary configuration of a filter housing that contains a filter for a photolithography fluid. Filter housing 2 includes ports 4 and flange 8 which may be useful in installing filter housing 2 in a designated location within a photolithography dispensing and coating apparatus. This configuration is exemplary only and in other exemplary embodiments, filter housing 2 may take on completely different configurations. Ports 4 are three in number and this is exemplary as well. In one exemplary embodiment, ports 4 may include an inlet port, an outlet port, and a separate port for purging. Filter housing material 10 may be Teflon or other suitable materials such as HDPE, high-density polyethylene, but other suitable materials may be used in other exemplary embodiments and depending upon the fluid being filtered in the filter housing.

Figure 2:
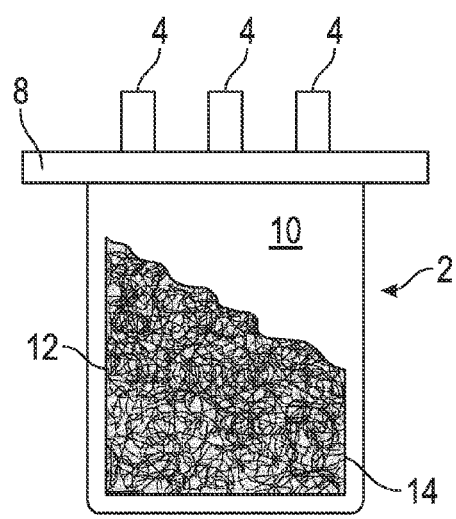
FIG. 2 is a side view of a housing with a cut-away portion showing a filter inside the filter housing.

FIG. 2 shows filter housing 2 with cutaway 12 exposing the interior of filter housing 2 and showing filter 14 contained within filter housing 2. Filter 14 is a porous filter material that may be formed of various suitable materials compatible with materials used in the semiconductor manufacturing industry. Filter 14 includes a microstructure that traps particles and may also trap bubbles, and provides its porosity. According to one exemplary embodiment, the filter may be formed of nylon, such as nylon 6, 6 ($N_{66}$) and according to other exemplary embodiments, the filter may be formed of polytetrafluoroethylene (Teflon or PTFE), high-density polyethylene (HDPE) ultra high molecular weight polyethylene (UHMWPE) or other suitable materials dictated by application. In one exemplary embodiment, filter 14 may be a photoresist filter and many photoresist filters are commercially available. According to another exemplary embodiment, filter 14 may be a developer filter. Many developer filters are commercially available.

After filter 14 has been in use for an amount of time, it will be replaced by a new filter. This is typically done by replacing the integrated unit of filter housing 2 that contains filter 14. When the new filter housing 2 unit is installed, fluid must be cycled through filter 14 until the fluid emanating from the filter housing is a continuous substantially homogenous fluid free of particles and bubbles.

Figure 3:
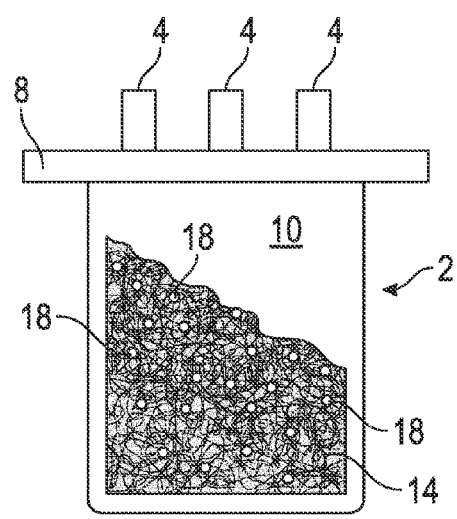
FIG. 3 is a side view showing bubbles formed within a filter shown in a cut-away portion of a filter housing.

FIG. 3 shows another cutaway view of filter 14 within filter housing 2 and shows a number of bubbles 18 retained within filter 14. This may represent the situation after a filter has been replaced by a newly installed filter and fluid is run through the filter, such as by entering through one port 4 and exiting through another port 4 or it may represent the situation whereby bubbles are created during continuous operation. The number and size of bubbles varies according to various exemplary embodiments and is determined in part by the nature and porosity of filter 14 and the viscosity of the particular fluid being filtered. When a new filter 14 is installed, and fluid is introduced into filter 14, the filter does not immediately saturate with fluid. Rather, small amounts of air remain trapped within the media due to the surface tension of the air bubbles adhering to the microstructure of filter 14. According to conventional techniques, a considerable volume of fluid must be run through a newly installed filter 14 or through any filter 14 replete with bubbles, in order to eventually dislodge bubbles 18.

Figure 4:
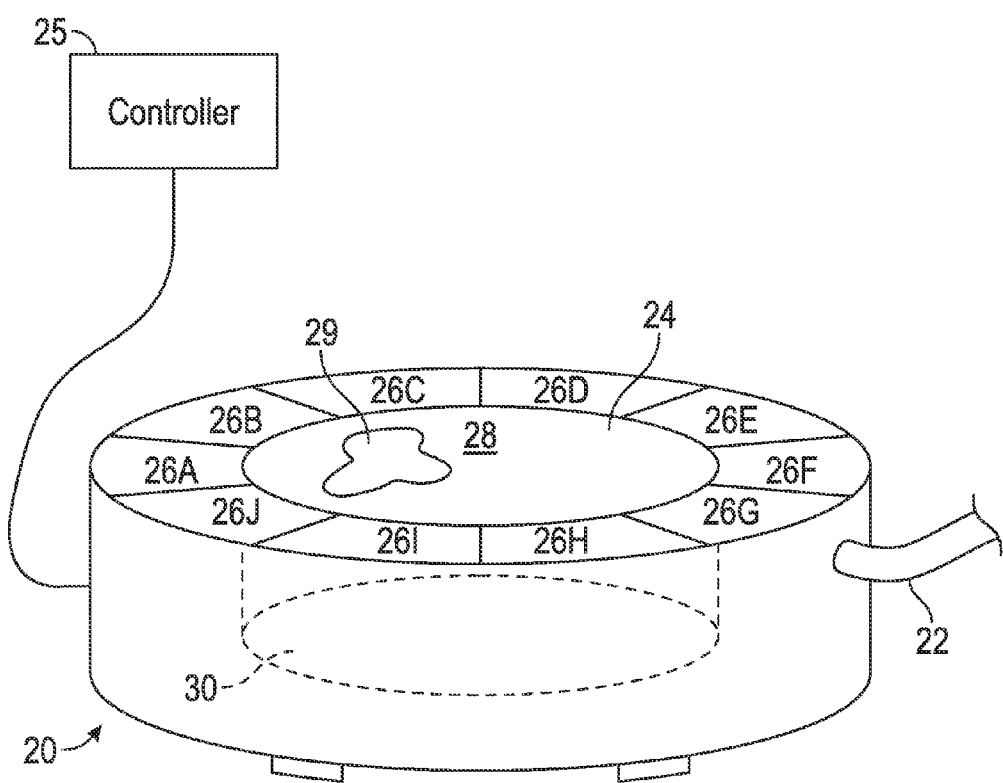
FIG. 4 is a perspective view of an exemplary acoustic wave generator according to the invention.

FIG. 4 is a perspective view showing an acoustic wave generator according to the disclosure. Acoustic wave generator 20 may be capable of generating ultrasonic energy, typically sound waves having a frequency of about 20-400 kHz and in one embodiment, about 100 kHz. According to another exemplary embodiment, acoustic wave generator 20 may generate megasonic energy, i.e. sound waves having a higher frequency that may range from 800-2000 kHz. In other exemplary embodiments, other high frequency sound waves may be used. Acoustic wave generator 20 is coupled to a power source through cord 22 and may include various suitable and known elements for generating and directing acoustic wave energy. Various suitable acoustic wave generating elements such as a piezoelectric crystal transducer, or other acoustic wave generating elements may be used. A commonly used piezo material is PZT ceramic, lead zirconate titanate. Barium titanate is another suitable piezo ceramic that may be used.

Acoustic wave generator 20 may be capable of producing multiple forms of acoustic energy, i.e. sound waves having frequencies that may vary and extend from the ultrasonic range to the megasonic range. Acoustic wave generator 20 may be operable to produce acoustic waves of multiple frequencies at different spatial locations and the waves may be directed in different directions. Acoustic wave generator 20 includes recess 24 and inner sidewalls 28 and base 30 for conterminously and detachably receiving a filter housing in recess 24. According to another exemplary embodiment, the filter housing may be received within opening 24 in a snug manner or a loose manner. Because the filter housing is received within opening 24 in a loose manner, it is easily detachable from acoustic wave generator 20. According to the various exemplary embodiments, acoustic wave generator 20 is capable of generating acoustic wave energy and directing it to filter 14 disposed within filter housing 2.

According to one exemplary embodiment, acoustic wave generator 20 may be annular in shape and may include energy zones such as zones 26A-26J at different spatial locations as illustrated. According to one exemplary embodiment, zones 26A-26J may be separately operable such that different zones may be operated at different times. According to one exemplary embodiment, zones 26A-26J may be sequentially powered on and off, thereby sequentially generating acoustic energy waves and sequentially directing the energy waves to the filter within filter housing 2. Zones 26A-26J thereby direct acoustic wave energy to a filter disposed within a housing received in opening 24, from different directions.

Each zone 26A-26J may include an individual separately operable transducer element capable of generating acoustic waves. According to one exemplary embodiment, zones 26A-26J may produce waves of different frequencies and in some exemplary embodiment, each zone 26A-26J may be capable of generating multiple wavelengths of acoustic waves. Various suitable acoustic wave generating elements such as piezoelectric crystals, or other acoustic wave generating transducers may be used.

Various controllers may be used to control acoustic wave generator 20 to produce to various effects described herein and, in particular, to separately control respective zones 26A-26J. The controller such as controller 25 of FIG. 4, may be programmable so as to control acoustic wave generator 20 using various recipes for the generation and delivery of the various acoustic waves.

It should be understood that the configurations shown in FIG. 4 is exemplary only. Other configurations for acoustic wave generator 20 may be utilized in other exemplary embodiments and may be designed in conjunction with the shape of the filter housing used in a particular coating apparatus.

Figure 5:
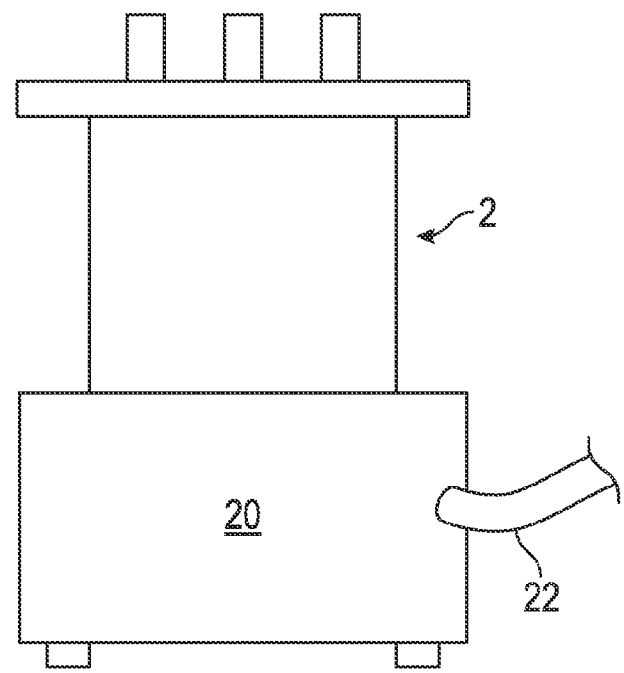
FIG. 5 is a side view of a filter housing containing a filter and received within and contacting an acoustic wave generator according to the invention.

FIG. 5 shows filter housing 2 received within exemplary acoustic wave generator 20 shown in FIG. 4. Filter housing 2 may be received within opening 24 of acoustic wave generator such that inner sidewalls 28 of opening 24 circumferentially contact the outer surfaces of filter housing 2. According to one exemplary embodiment, and referring to FIG. 4, a gel may be spread along inner sidewalls 28 or filter housing 2 or both, such that the gel is disposed at the interface between a surface of acoustic wave generator 20 and a surface of filter housing 2 when they are in contact. A portion of gel 29 is shown in FIG. 4. The gel may be sorbothane or any gel that provides good contact such as other elastic polymers or viscoelastic materials.

Figure 6:
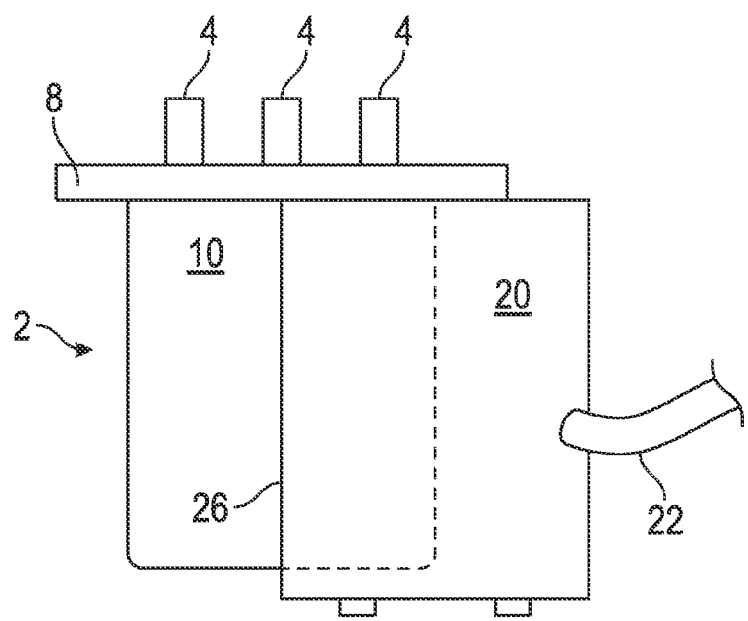
FIG. 6 is another exemplary embodiment showing a filter housing containing a filter and contacting an acoustic wave generator according to the invention.

FIG. 6 shows another exemplary configuration of acoustic wave generator 20. According to the illustrated embodiment in FIG. 6, filter housing 2 such as illustrated in previous figures, is received within a semicircular recess formed within acoustic wave generator 20. In this exemplary embodiment, a different contact area is provided between acoustic wave generator 20 and filter housing 2. Although acoustic wave generator 20 does not completely circumferentially surround filter housing 2, acoustic wave generator 20 contacts filter housing 2 at vertical locations up to flange 8.

FIGS. 5 and 6 are intended to be exemplary only and in other exemplary embodiments, acoustic wave generator 20 and filter housing 2 may each take on different configurations. In other exemplary embodiments, acoustic wave generator 20 may be itself reconfigurable to accommodate differently shaped and sized filter housings and different installation configurations. An aspect of the disclosure is that filter housing 2 is in suitably close proximity to acoustic wave generator 20 such that acoustic wave generator 20 directs acoustic wave energy into filter 14 disposed within filter housing 2. In some exemplary embodiments, filter housing 2 and acoustic wave generator 20 may be in close proximity. In other exemplary embodiments, filter housing 2 and acoustic wave generator 20 may be in contact and in other exemplary embodiments, filter housing 2 may be partially or completely received within an opening or other recess formed in acoustic wave generator 20.

The acoustic wave energy in the form of an ultrasonic, megasonic or other high frequency acoustic wave, causes the disengagement of any bubbles that may be present in filter 14, such as may be generated during continuous normal operation or such as may be present after a new filter is installed and the fluid has been introduced to the filter and cycled through the filter to qualify the filter for production use. In this manner, bubbles are quickly removed from filter 14 and the filter is quickly qualified for production use. According to various exemplary embodiments, detectors that detect bubbles in a fluid line may be coupled to the outlet fluid line from the filter housing and the time at which the newly installed filter is free of bubbles, may be automatically detected.

According to one aspect, provided is an apparatus comprising a porous filter media disposed within a housing and an acoustic wave generator contacting the housing and capable of applying acoustic energy to the porous filter media.

According to another aspect, provided is a photolithography coating apparatus. The apparatus comprises a dispense station including a chuck for receiving a substrate thereon, a dispense port positioned to dispense a photolithography fluid to a substrate on the chuck, a source of the photolithography fluid, a filter for filtering the photolithography fluid, the filter comprising a porous filter media within a housing, and an acoustic wave generator contacting the housing and capable of applying acoustic energy to the porous filter media.

Figure 7:
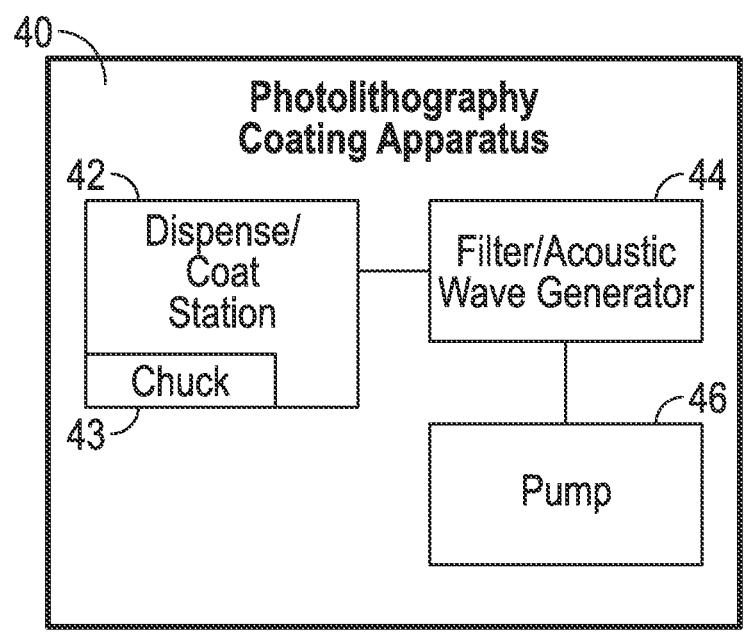
FIG. 7 represents a photolithography coating tool including a filter/acoustic wave generator unit according to the invention.

FIG. 7 is a labeled representation of an exemplary photolithography crating apparatus 40 including dispense/coat station 42, filter/acoustic wave generator unit 44 and pump 46, as components therein, according to various exemplary embodiments. Dispense/coat station 42 includes chuck 43 for receiving a substrate thereon.

Another aspect of the disclosure is a method for preparing a filter for use in a fluid dispensing system. The method comprises providing a porous filter in a housing, the housing comprising an inlet port and an outlet port coupled to a dispense line and directing acoustic waves to the porous filter using an acoustic wave generator that contacts the housing.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as lower, upper, horizontal, vertical, above, below, up, down, top and bottom as well as derivatives thereof (e.g., horizontally, downwardly, upwardly, etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A photolithography coating apparatus comprising:
    a dispense station including a chuck for receiving a substrate thereon;
    a dispense port positioned to dispense a photolithography fluid onto a substrate on said chuck;
    a source of said photolithography fluid;
    a filter for filtering said photolithography fluid, said filter comprising a porous filter media within a housing having an inlet port and an outlet port; and
    an acoustic wave generator that applies acoustic energy to said porous filter media, said acoustic wave generator including a base with a recessed portion wherein said recessed portion is a cavity in an exterior surface of said base and said recessed portion receives said housing therein and side portions of said recessed portion of said base conterminously surround said housing.

2. The photolithography coating apparatus as in claim 1, wherein said acoustic energy comprises one of ultrasonic energy and megasonic energy.

3. The photolithography coating apparatus as in claim 1, wherein said photolithography fluid comprises photoresist and said porous filter media comprises a photoresist filter.

4. The photolithography coating apparatus as in claim 1, wherein said photolithography fluid comprises developer, said porous filter media comprises a developer filter and further comprising a gel disposed at an interface between said acoustic wave generator and said housing.

5. The photolithography coating apparatus as in claim 1, further comprising a pump that pumps said photolithography fluid through said porous filter media and to said dispense port.

6. The photolithography coating apparatus as in claim 1, wherein said acoustic wave generator includes a controller that generates and applies said acoustic energy with different frequencies, in different directions and at different spatial locations.

7. The photolithography coating apparatus as in claim 1, wherein said acoustic wave generator includes a plurality of separately operable zones.

8. A photolithography coating apparatus comprising:
    a dispense station including a chuck for receiving a substrate thereon;
    a dispense port positioned to dispense a photolithography fluid onto a substrate on said chuck;
    a source of said photolithography fluid;
    a filter for filtering said photolithography fluid, said filter comprising a porous filter media within a housing; and
    an acoustic wave generator that applies acoustic energy to said porous filter media, said acoustic wave generator including a base with a recessed portion wherein said recessed portion is a cavity in an exterior surface of said base' said recessed portion receives said housing therein and side portions of said recessed portion of said base conterminously surround said housing.

9. The photolithography coating apparatus as in claim 8, wherein said acoustic wave generator includes a controller that generates and applies said acoustic energy with different frequencies, in different directions and at different spatial locations.

10. The photolithography coating apparatus as in claim 8, wherein said acoustic wave generator detachably receives said housing therein.

11. The photolithography coating apparatus as in claim 10, further comprising a gel disposed at an interface between said acoustic wave generator and said housing.

12. The photolithography coating apparatus as in claim 10, wherein said acoustic wave generator includes a controller that generates and applies said acoustic energy with different frequencies, in different directions and at different spatial locations.

13. The photolithography coating apparatus as in claim 8, wherein said acoustic wave generator includes a plurality of separately operable zones.

14. The photolithography coating apparatus as in claim 13, wherein said acoustic wave generator detachably receives said housing therein.

15. The photolithography coating apparatus as in claim 1, wherein said inlet port and said outlet port are on the same side of said housing.

16. The photolithography coating apparatus as in claim 8, wherein said cavity has a circular shape and said side portions comprise a continuous sidewall that circularly surrounds said recessed portion by extending around a circumference of said circular shape.

17. The photolithography coating apparatus as in claim 8, wherein said recessed portion includes a circular recessed surface recessed with respect to said exterior surface of said base.

* * * * *

UNITED STATES PATENT AND TRADEMARK OFFICE
CERTIFICATE OF CORRECTION

| | | |
|---|---|---|
| PATENT NO. | : 8,911,552 B2 | Page 1 of 1 |
| APPLICATION NO. | : 13/209304 | |
| DATED | : December 16, 2014 | |
| INVENTOR(S) | : Guy Jacobson | |

It is certified that error appears in the above-identified patent and that said Letters Patent is hereby corrected as shown below:

Claims

Column 8, claim 8, line 13, replace "base'" with --base,--

Signed and Sealed this
Twenty-seventh Day of October, 2015

Michelle K. Lee
*Director of the United States Patent and Trademark Office*